(12) United States Patent
Stobart et al.

(10) Patent No.: US 12,407,442 B2
(45) Date of Patent: Sep. 2, 2025

(54) FORWARD ERROR CORRECTION (FEC) FOR DUMMY BEARERS IN DIGITAL ENHANCED CORDLESS TELECOMMUNICATIONS (DECT) ULTRA LOW ENERGY (ULE) NETWORKS

(71) Applicant: Synaptics Incorporated, San Jose, CA (US)

(72) Inventors: Christopher P. Stobart, Nuremberg (DE); Otmar P. Rengert, Nuremberg (DE)

(73) Assignee: Synaptics Incorporated, San Jose, CA (US)

( * ) Notice: Subject to any disclaimer, the term of this patent is extended or adjusted under 35 U.S.C. 154(b) by 0 days.

(21) Appl. No.: 18/435,277

(22) Filed: Feb. 7, 2024

(65) Prior Publication Data

US 2025/0253975 A1  Aug. 7, 2025

(51) Int. Cl.
  *H04L 1/00*   (2006.01)
  *H03M 13/00*  (2006.01)
  *H03M 13/11*  (2006.01)

(52) U.S. Cl.
  CPC ....... *H04L 1/0045* (2013.01); *H03M 13/1105* (2013.01); *H03M 13/611* (2013.01); *H04L 1/0061* (2013.01)

(58) Field of Classification Search
  CPC ... H04L 1/0041; H04L 1/0045; H04L 1/0061; H03M 13/05; H03M 13/37; H03M 13/1105; H03M 13/611
  See application file for complete search history.

(56) References Cited

U.S. PATENT DOCUMENTS

| | | | |
|---|---|---|---|
| 2009/0168763 A1* | 7/2009 | Choi | H04W 28/26 370/352 |
| 2012/0202484 A1* | 8/2012 | Dickinson | H04W 16/14 455/426.1 |

FOREIGN PATENT DOCUMENTS

EP   1026850 A2 *  8/2000  ........... H04L 1/0072

OTHER PUBLICATIONS

ETSI EN 300 175-3, version 2.9.1, Digital Enhanced Cordless Telecommunications (DECT); Common Interface (CI); Part 3: Medium Access Control (MAC) layer, Mar. 2022, pp. 1-373.

(Continued)

*Primary Examiner* — Shelly A Chase
(74) *Attorney, Agent, or Firm* — Paradice & Li LLP

(57) ABSTRACT

This disclosure provides methods, devices, and systems for wireless communications. The present implementations more specifically relate to packet designs that support forward error correction (FEC) coding for digital enhanced cordless telecommunications (DECT) ultra low energy (ULE) dummy bearers. In some aspects, an "enhanced" dummy bearer may include an S-field, an A-field, and a B-field, followed by one or more parity bits. The S-field carries a packet preamble and synchronization information which marks the start of a DECT packet transmission. The A-field carries control information associated with a DECT base station or network. The B-field carries control information associated with a ULE mode of operation by the base station. The parity bits may be combined with one or more fields (or subfields) of the dummy bearer to produce FEC codewords that can be decoded according to an FEC coding scheme.

20 Claims, 14 Drawing Sheets

(56) References Cited

OTHER PUBLICATIONS

EP Search Report dated Jun. 10, 2025, from EP Application No. 25155947.2-1206.
"Digital Enhanced Cordless Telecommunications (DECT); Ultra Low Energy (ULE); Machine to Machine Communications; Part 2: Home Automation Network (phase 2)", ETSI Draft Specification; 102 939-2, European Telecommunications Standards Institute (ETSI), 650, Route Des Lucioles ; F-06921 Sophia-Antipolis; France, No. V1.3.3 May 23, 2023 (May 23, 2023), pp. 1-97, XP014448027, Retrieved from the Internet: URL:ftp://docbox.etsi.org/DECT/DECT/70-Draft/00390/DECT-00390v133.docx.
DSPG Edinburgh Ltd: "DECT-2020 Dummy Bearer Information", ETSI Draft; DECT(19)000213R1, European Telecommunications Standards Institute (ETSI), 650, Route Des Lucioles ; F-06921 Sophia-Antipolis; France, Sep. 25, 2019 (Sep. 25, 2019), pp. 1-9, XP014351296, Retrieved from the Internet: URL: docbox.etsi.org/DECT/DECT/05-CONTRIBUTIONS/2019/DECT(19)000213r1_DECT-2020_Dummy_Bearer_Information.doc.
SYNA: "Draft—REN/DECT-00402 v2.9.2 (EN 300 175-3 ) Base standard part 3 (1 to 8)", ETSI Draft; DECT(24) 000019, European Telecommunications Standards Institute (ETSI), 650, Route Des Lucioles ; F-06921 Sophia-Antipolis; France, No. 2.9.2 Jan. 11, 2024 (Jan. 11, 2024), pp. 1-373, XP014478344, Retrieved from the Internet: URL:ftp://docbox.etsi.org/DECT/DECT/05-CONTRIBUTIONS/2024/DECT(24)000019_Draft_-_REN_DECT-00402_v2_9_2_EN_300_175-3_Base_standar.zip DECT-00402v292.docx.

* cited by examiner

FORWARD ERROR CORRECTION (FEC) FOR DUMMY BEARERS IN DIGITAL ENHANCED CORDLESS TELECOMMUNICATIONS (DECT) ULTRA LOW ENERGY (ULE) NETWORKS

TECHNICAL FIELD

The present implementations relate generally to wireless communication, and specifically to forward error correction (FEC) for dummy bearers in digital enhanced cordless telecommunications (DECT) ultra low energy (ULE) networks.

BACKGROUND OF RELATED ART

Digital enhanced cordless telecommunications (DECT) ultra low energy (ULE) is a wireless communication standard that can be used to implement home automation, security, and climate control in residential and enterprise environments. The basic building block of a ULE system is a home automation network (HAN) that includes a fixed part (FP) and at least one portable part (PP). A DECT ULE PP can be any portable device used in home automation, security, or climate control applications. Example suitable portable devices include, among other examples, sensors (such as smoke detectors or motion detectors), thermostats, and electricity control elements. The DECT ULE FP is a base station or access point that bridges a connection between the portable devices and a local network (or the Internet). The base station communicates with the portable devices over a DECT air interface. Each over-the-air (OTA) connection between the base station and a respective portable device is referred to as a wireless communication "link."

A base station periodically transmits or broadcasts "dummy bearers" (also referred to as "beacons") to enable any portable devices within wireless communication range of the base station to establish or maintain a communication link with the base station or network. For example, a base station may transmit a dummy bearer every 10 ms. Dummy bearers are network packets that carry control information which can be used by a portable device to identify the base station and synchronize to it. Dummy bearers also may carry paging information that can be used by a portable device to receive incoming messages or connections from the base station.

Imperfect channel conditions on the DECT air interface may result in data loss during the transmission of dummy bearers. In existing DECT ULE networks, a portable device that receives incomplete (or incorrect) dummy bearer information may be unable to recover the dummy bearer using the received information. Accordingly, the portable device discards the received dummy bearer information and waits for the base station to broadcast another dummy bearer, resulting in a waste of the portable device's resources (including memory, power, and processing resources). Thus, there is a need to improve the ability of a portable device to receive dummy bearers from a base station under imperfect channel conditions.

SUMMARY

This Summary is provided to introduce in a simplified form a selection of concepts that are further described below in the Detailed Description. This Summary is not intended to identify key features or essential features of the claimed subject matter, nor is it intended to limit the scope of the claimed subject matter.

One innovative aspect of the subject matter of this disclosure can be implemented in a method of wireless communication performed by a wireless communication device. The method includes receiving, over a wireless communication channel, at least a portion of a dummy bearer that includes a B-field followed by one or more first parity bits, the B-field carrying control information associated with an ultra low energy (ULE) mode of operation by a digital enhanced cordless telecommunications (DECT) base station; constructing a first codeword that includes at least part of the B-field and the one or more first parity bits; and recovering the control information based on the first codeword and a forward error correction (FEC) code associated with the first codeword.

Another innovative aspect of the subject matter of this disclosure can be implemented in a wireless communication device, including a processing system and a memory. The memory stores instructions that, when executed by the processing system, cause the wireless communication device to receive, over a wireless communication channel, at least a portion of a dummy bearer that includes a B-field followed by one or more first parity bits, the B-field carrying control information associated with a ULE mode of operation by a DECT base station; construct a first codeword that includes at least part of the B-field and the one or more first parity bits; and recover the control information based on the first codeword and a FEC code associated with the first codeword.

BRIEF DESCRIPTION OF THE DRAWINGS

The present implementations are illustrated by way of example and are not intended to be limited by the figures of the accompanying drawings.

DETAILED DESCRIPTION

Figure 1:
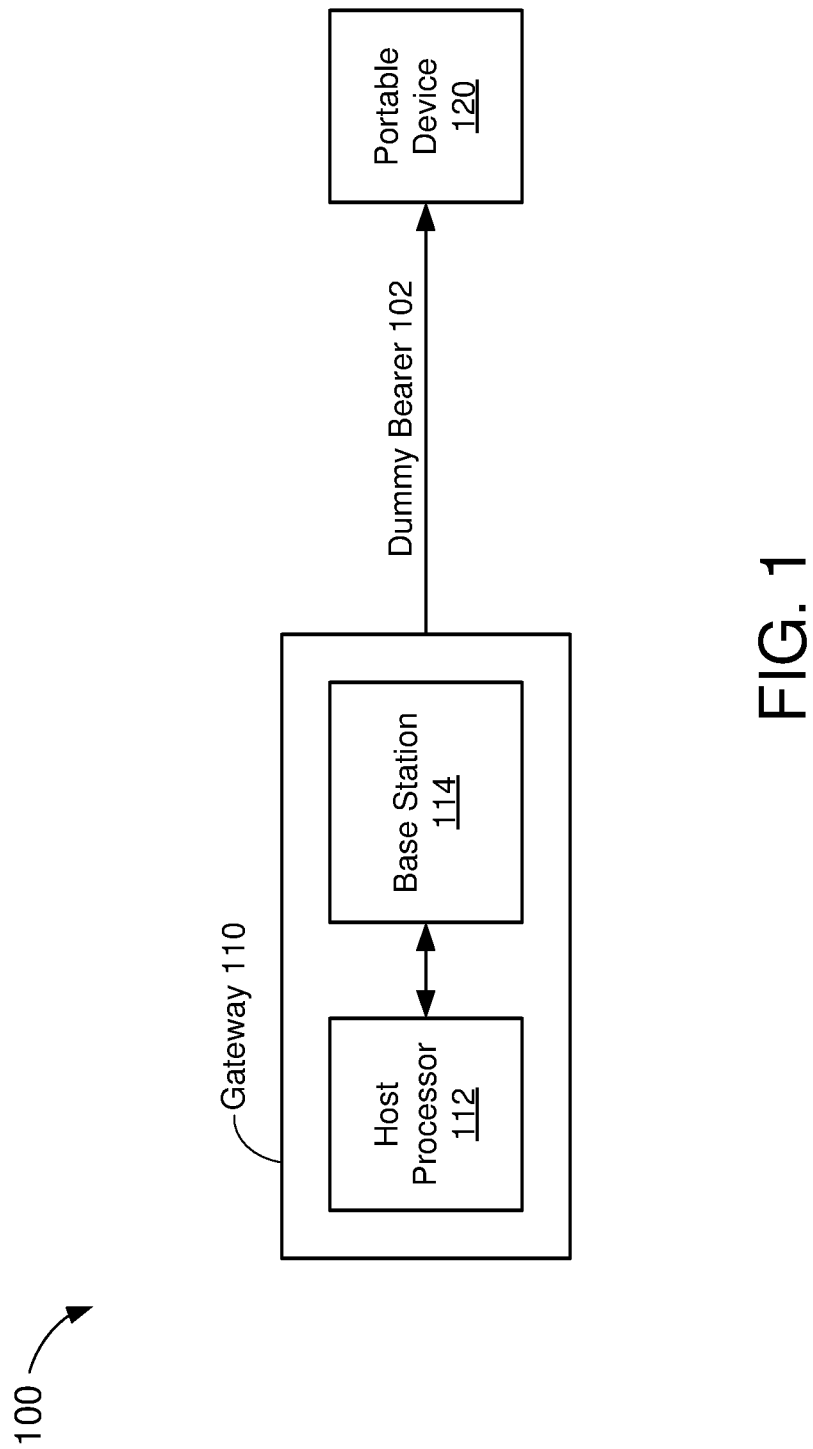
FIG. 1 shows an example wireless communication network.

In the following description, numerous specific details are set forth such as examples of specific components, circuits, and processes to provide a thorough understanding of the present disclosure. The term "coupled" as used herein means connected directly to or connected through one or more intervening components or circuits. The terms "electronic system" and "electronic device" may be used interchangeably to refer to any system capable of electronically processing information. Also, in the following description and for purposes of explanation, specific nomenclature is set forth to provide a thorough understanding of the aspects of the disclosure. However, it will be apparent to one skilled in the art that these specific details may not be required to practice the example embodiments. In other instances, well-known circuits and devices are shown in block diagram form to avoid obscuring the present disclosure. Some portions of the detailed descriptions which follow are presented in terms of procedures, logic blocks, processing and other symbolic representations of operations on data bits within a computer memory.

These descriptions and representations are the means used by those skilled in the data processing arts to most effectively convey the substance of their work to others skilled in the art. In the present disclosure, a procedure, logic block, process, or the like, is conceived to be a self-consistent sequence of steps or instructions leading to a desired result. The steps are those requiring physical manipulations of physical quantities. Usually, although not necessarily, these quantities take the form of electrical or magnetic signals capable of being stored, transferred, combined, compared, and otherwise manipulated in a computer system. It should be borne in mind, however, that all of these and similar terms are to be associated with the appropriate physical quantities and are merely convenient labels applied to these quantities.

Unless specifically stated otherwise as apparent from the following discussions, it is appreciated that throughout the present application, discussions utilizing the terms such as "accessing," "receiving," "sending," "using," "selecting," "determining," "normalizing," "multiplying," "averaging," "monitoring," "comparing," "applying," "updating," "measuring," "deriving" or the like, refer to the actions and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

In the figures, a single block may be described as performing a function or functions; however, in actual practice, the function or functions performed by that block may be performed in a single component or across multiple components, and/or may be performed using hardware, using software, or using a combination of hardware and software. To clearly illustrate this interchangeability of hardware and software, various illustrative components, blocks, modules, circuits, and steps have been described below generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure. Also, the example input devices may include components other than those shown, including well-known components such as a processor, memory and the like.

The techniques described herein may be implemented in hardware, software, firmware, or any combination thereof, unless specifically described as being implemented in a specific manner. Any features described as modules or components may also be implemented together in an integrated logic device or separately as discrete but interoperable logic devices. If implemented in software, the techniques may be realized at least in part by a non-transitory processor-readable storage medium including instructions that, when executed, performs one or more of the methods described above. The non-transitory processor-readable data storage medium may form part of a computer program product, which may include packaging materials.

The non-transitory processor-readable storage medium may comprise random access memory (RAM) such as synchronous dynamic random-access memory (SDRAM), read only memory (ROM), non-volatile random access memory (NVRAM), electrically erasable programmable read-only memory (EEPROM), FLASH memory, other known storage media, and the like. The techniques additionally, or alternatively, may be realized at least in part by a processor-readable communication medium that carries or communicates code in the form of instructions or data structures and that can be accessed, read, and/or executed by a computer or other processor.

The various illustrative logical blocks, modules, circuits and instructions described in connection with the embodiments disclosed herein may be executed by one or more processors (or a processing system). The term "processor," as used herein may refer to any general-purpose processor, special-purpose processor, conventional processor, controller, microcontroller, and/or state machine capable of executing scripts or instructions of one or more software programs stored in memory.

As described above, base stations in digital enhanced cordless telecommunications (DECT) ultra low energy (ULE) networks periodically transmit or broadcast "dummy bearers" (also referred to as "beacons") to enable any portable devices within wireless communication range to establish or maintain a communication link with the base station or network. However, imperfect channel conditions on the DECT air interface may result in data loss during the transmission of dummy bearers. Aspects of the present disclosure recognize that forward error correction (FEC) codes (also referred to as "error-correcting codes") can compensate for the intrinsic unreliability of information transfer in wireless communication systems by introducing redundancy into the data stream. Example suitable FEC codes include Reed-Solomon codes, turbo codes, and low-density parity-check (LDPC) codes, among other examples. Existing versions of the DECT ULE standard do not support FEC coding for dummy bearers. Thus, new packet designs are needed to enable FEC coding for the transmission and reception of dummy bearers in a DECT ULE network.

Various aspects relate generally to DECT ULE networks, and more particularly, to packet designs that support FEC coding for DECT ULE dummy bearers. In some aspects, an "enhanced" dummy bearer may include an S-field, an A-field, and a B-field, followed by one or more parity bits. The S-field carries a packet preamble and synchronization information which marks the start of a DECT packet transmission. The A-field carries control information associated with a DECT base station or network (such as an identity of the base station, one or more capabilities of the base station, whether the base station currently supports new subscriptions, and page messages indicating incoming connections). The B-field carries control information associated with a ULE mode of operation by the base station (such as channel selection information and page messages indicating incoming connections). The parity bits may be combined with one or more fields (or subfields) of the dummy bearer to produce FEC codewords that can be decoded according to an FEC coding scheme.

In some aspects, a portable device may recover or reproduce portions of the dummy bearer that were lost during transmission (such as bits that were erased or altered) based on the decoded FEC codewords. In some implementations, the parity bits may be associated with the B-field of the dummy bearer. In such implementations, the parity bits may be used to recover the control information carried in the B-field. In some other implementations, the parity bits may be associated with the A-field of the dummy bearer. In such implementations, the parity bits may be used to recover the control information carried in the A-field. Still further, in some implementations, the parity bits may include one or more first parity bits associated with the B-field followed by one or more second parity bits associated with the A-field. In such implementations, the first parity bits may be used to recover the control information carried in the B-field and the second parity bits may be used, independent of the first parity bits, to recover the control information carried in the A-field.

Particular implementations of the subject matter described in this disclosure can be implemented to realize one or more of the following potential advantages. By adding FEC coding to DECT ULE dummy bearers, aspects of the present disclosure can improve the robustness of the dummy bearers to imperfect channel conditions on the DECT air interface. For example, adding parity bits to a dummy bearer allows a portable device to recover control information that would otherwise be lost during transmission. As a result, the portable device may conserve memory, power, and processing resources that would otherwise be used to receive another transmission of the dummy bearer. By adding the parity bits to the end of the dummy bearer (after the A-field and the B-field), the packet formats of the present disclosure may be backwards compatible with legacy devices. As used herein, the term "legacy" device refers to any portable device (or base station) that conforms to existing versions of the DECT ULE standard and does not support FEC coding of dummy bearers. Legacy devices may terminate reception of a dummy bearer once the A-field or the B-field has been received, and thus not receive the parity bits.

FIG. 1 shows an example wireless communication network 100. In some aspects, the wireless communication network 100 may be one example of a home automation network (HAN) conforming to the digital enhanced cordless telecommunications (DECT) ultra low energy (ULE) wireless communication standard. The network 100 includes a gateway 110 and a portable device 120. Although a single portable device 120 is shown in the example of FIG. 1 (for simplicity), the network 100 may include any number of portable devices.

The gateway 110 includes a host processor 112 and a base station 114. The base station 114 (also referred to as a "root node") represents a fixed part (FP) of the network 100. More specifically, the base station 114 enables the host processor 112 to communicate with portable devices in the network 100 (such as the portable device 120) over a DECT air interface. For example, the base station 114 may transmit downlink messages, via the DECT air interface, to the portable device 120 on behalf of the host processor 112. The base station 114 also may receive uplink messages, via the DECT air interface, from the portable device 120 and provide the received messages to the host processor 112.

The portable device 120 (also referred to as a "leaf") represents a portable part (PP) of the network 100. In some implementations, the portable device 120 may support a ULE mode of operation defined by the DECT ULE standard. Portable devices that support the ULE mode are referred to herein as "ULE devices." A ULE device can be any portable device that is used in home automation, security, or climate control applications. Example suitable portable devices may include sensors (such as smoke detectors or motion sensors), thermostats, and electricity control elements, among other examples. In some other implementations, the portable device 120 may not support the ULE mode of operation. Portable devices that do not support the ULE mode may be referred to herein as "DECT devices."

The base station 114 periodically transmits or broadcasts dummy bearers 102 (also referred to as "beacons") over the DECT air interface. For example, existing versions of the DECT ULE standard require each base station to broadcast a dummy bearer every 10 ms. The dummy bearer 102 is a network packet that carries control information which can be used by any portable devices within wireless communication range of the base station 114 (such as the portable device 120) to identify the base station 114 and synchronize to it. The dummy bearer 102 also may carry paging information which can be used by portable devices that are synchronized with the base station 114 to receive incoming messages or connections from the base station 114.

Figure 2:
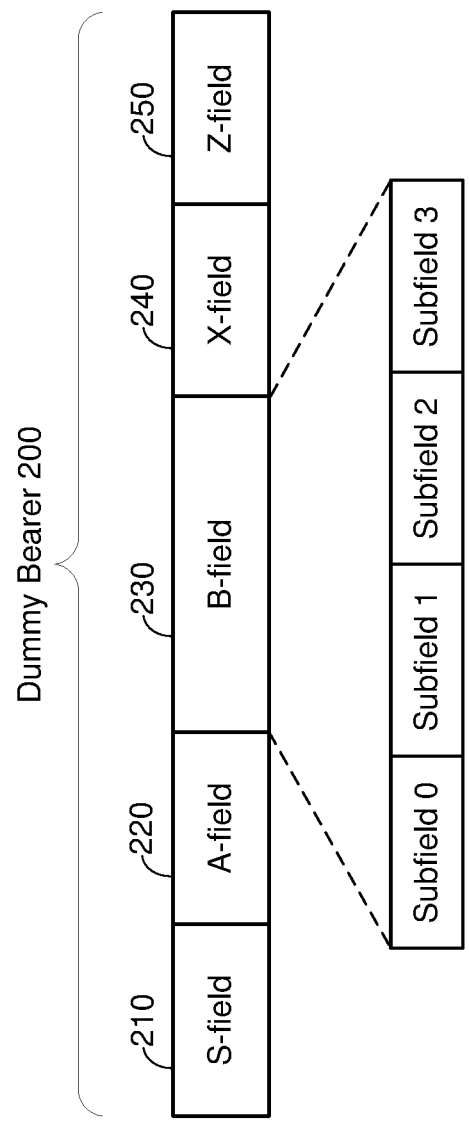
FIG. 2 shows an example dummy bearer usable for wireless communications between a base station and a portable device.

FIG. 2 shows an example dummy bearer 200 usable for wireless communications between a base station and a portable device. More specifically, the dummy bearer 200 conforms to a packet format defined by existing versions of the DECT ULE standard (also referred to as a "legacy" dummy bearer packet format).

The dummy bearer 200 includes an S-field 210, an A-field 220, a B-field 230, an X-field 240, and a Z-field 250. The S-field 210 carries a packet preamble and synchronization information which marks the start of a DECT packet transmission. All portable devices, including DECT devices and ULE devices, receive the S-field 210 of at least one dummy bearer broadcast by a base station (such as during an initial subscription or service call procedure, among other examples) to prepare or configure their receivers to receive the remainder of the dummy bearer 200 (such as by adjusting the receiver frequency or recovering signal timing information). Unlike DECT devices, which receive the S-field 210 of each dummy bearer 200 transmitted by a base station, ULE devices may ignore the S-field 210 of subsequent dummy bearers 200 received during a "normal" operation (such as for incoming connection notifications).

The A-field 220 carries control information associated with a base station or network (such as an identity of the base station, one or more capabilities of the base station, whether the base station currently supports new subscriptions, and page messages indicating incoming connections). All portable devices, including DECT devices and ULE devices, also receive the A-field 220 of at least one dummy bearer broadcast by a base station (such as during an initial subscription or service call procedure, among other examples) to acquire current network information (such as available timeslots for transmission or information about incoming connections). Unlike DECT devices, which receive the A-field 220 of each dummy bearer 200 transmitted by a base station, ULE devices may ignore the A-field 220 of subsequent dummy bearers 200 received during a "normal" operation (such as for incoming connection notifications).

The B-field 230 carries control information associated with a ULE mode of operation by the base station. Thus, only ULE devices may receive or interpret the B-field 230 of the dummy bearer 200, whereas DECT devices may terminate their reception of the dummy bearer 200 after receiving the A-field 220. According to existing versions of the DECT ULE standard, the B-field 230 is subdivided into four subfields. The first subfield (Subfield 0) signals the start of the B-field 230 and may include information that identifies the base station. The remaining subfields (Subfield 1, Subfield 2, and Subfield 3) carry the control information relevant for ULE operation (such as channel selection information and page messages indicating incoming connections).

ULE devices may use the information in Subfield 0 to prepare or configure their receivers to receive the remainder of the dummy bearer 200 (such as by adjusting the receiver frequency or recovering signal timing information) and to verify whether the dummy bearer 200 is associated with a desired base station. Thus, during normal operation, ULE devices may begin receiving the dummy bearer 200 starting from the B-field 230 (such as by detecting Subfield 0). ULE devices may further use the control information carried in Subfields 1-3 to set up connections for ULE data transfers and to check for incoming connections.

The X-field 240 carries cyclic redundancy check (CRC) information generated over parts of the B-field 230, and the Z-field 250 is a duplication of the X-field 240. Portable devices (such as DECT devices and ULE devices) may use the CRC information in the X-field 240 to determine whether the B-field 230 contains any errors and may use the Z-field 250 to detect interference at the end of the dummy bearer 200. However, many DECT devices ignore the B-field 230 entirely and may thus also ignore the X-field 240 and the Z-field 250. Moreover, existing versions of the DECT ULE standard do not support mechanisms for notifying the base station of any detected interference. As a result, some ULE devices also ignore the Z-field 250.

Imperfect channel conditions on the DECT air interface may result in data loss during the transmission of dummy bearers. For example, one or more bits of the dummy bearer 200 may be erased or altered when the dummy bearer 200 reaches a portable device (such as the portable device 120 of FIG. 1). Aspects of the present disclosure recognize that forward error correction (FEC) codes (also referred to as "error-correcting codes") can compensate for the intrinsic unreliability of information transfer in wireless communication systems by introducing redundancy into the data stream. In some aspects, a base station may encode at least a portion of a dummy bearer according to an FEC coding scheme. A portable device may correct errors in the received data by decoding the dummy bearer according to the FEC coding scheme.

Figure 3:
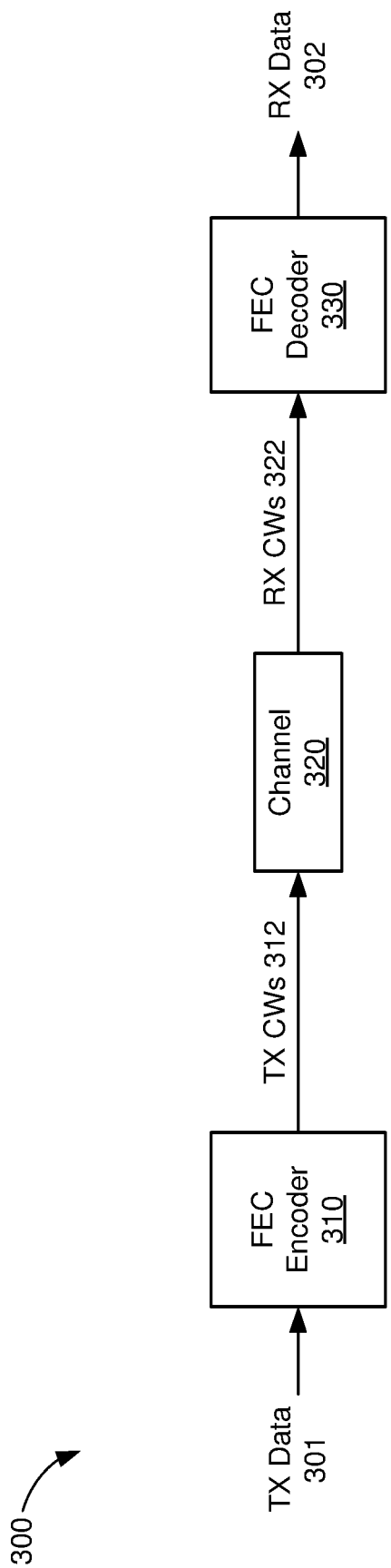
FIG. 3 shows a block diagram of an example communication system that supports forward error correction (FEC) coding.

FIG. 3 shows a block diagram of an example communication system 300 that supports FEC coding. The communication system 300 includes a FEC encoder 310, a channel 320, and a FEC decoder 330. The FEC encoder 310 may be included in, or correspond to, a transmitting device. In some implementations, the transmitting device may be one example of the base station 114 of FIG. 1. The decoder 320 may be included in, or correspond to, a receiving device. In some implementations, the receiving device may be one example of the portable device 120 of FIG. 1.

The channel 320 may include any communication link between the encoder 310 and the decoder 330. In some implementations, the channel 320 may be a wireless communication medium (such as a DECT air interface). Imperfections in the channel 320 may introduce channel distortion (such as linear distortion, multi-path effects, Additive White Gaussian Noise (AWGN), and the like). To compensate for channel imperfections, the encoder 310 may encode (TX) data 301 to be transmitted over the channel 320 so that error correction may be performed by the decoder 330 to recover the (RX) data 302.

In some implementations, the FEC encoder 310 may use one or more FEC codes to encode the TX data 301 into one or more TX codewords (CWs) 312. Example suitable FEC codes include Reed-Solomon codes, turbo codes, and low-density parity-check (LDPC) codes, among other examples. The FEC decoder 330 may use the same FEC codes to decode one or more RX codewords (CWs) 322, received via the channel 320, and recover the RX data 302. If the channel 320 introduces errors (such as erased or altered bits) into the TX codewords 312, the decoder 330 may detect and correct such errors in the RX codewords 322, according to the FEC code, so that the RX data 302 matches the TX data 301.

The FEC encoding operation adds one or more parity bits to the TX data 301 (such that each TX codeword 312 includes the TX data 301 plus the one or more parity bits). In some implementations, the TX data 301 may include one or more portions of a dummy bearer (such as the dummy bearer 200 of FIG. 2). However, existing versions of the DECT ULE standard do not support FEC coding for dummy bearers. Thus, new packet designs are needed to enable FEC coding for the transmission and reception of dummy bearers in a DECT ULE network.

Figure 4:
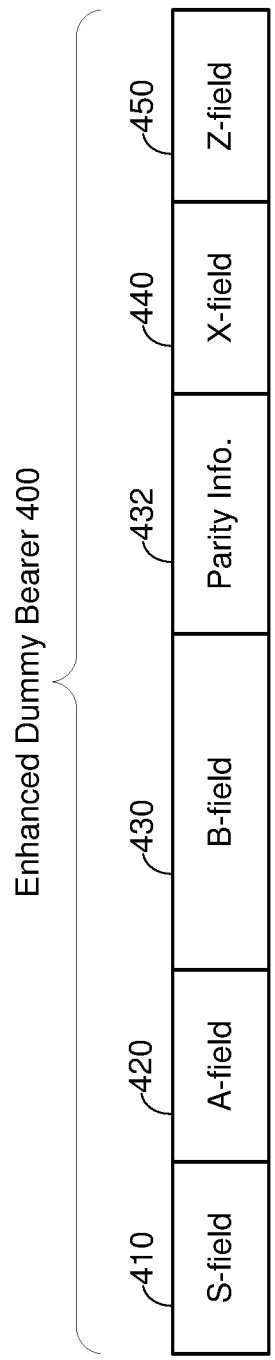
FIG. 4 shows an enhanced dummy bearer usable for wireless communications between a base station and a portable device, according to some implementations.

FIG. 4 shows an enhanced dummy bearer 400 usable for wireless communications between a base station and a portable device, according to some implementations. In some implementations, the enhanced dummy bearer 400 may be one example of the dummy bearer 102 of FIG. 1.

The enhanced dummy bearer 400 includes an S-field 410, an A-field 420, a B-field 430, an X-field 440, a Z-field 450, and parity information 432. In some implementations, the S-field 410, A-field 420, and B-field 430 may be examples of the S-field 210, A-field 220, and B-field 230, respectively, of FIG. 2. For example, the S-field 410 may carry a packet preamble and synchronization information which marks the start of a DECT packet transmission; the A-field 420 may carry control information associated with a base station or network; and the B-field 430 may carry control information associated with a ULE mode of operation by the base station. In some implementations, the X-field 440 may carry CRC information generated over parts of the B-field 430, and the Z-field 450 may be a duplication of the X-field 440.

In some aspects, the parity information 432 may be used to correct errors in the enhanced dummy bearer 400 according to an FEC coding scheme. For example, the parity information 432 may be combined with one or more portions of the enhanced dummy bearer 400 to produce FEC codewords that can be decoded, using the FEC coding scheme, to recover bits that were erased or altered during transmission over a DECT air interface (such as described with reference to FIG. 3). Example suitable FEC codes include Reed-Solomon codes, turbo codes, and LDPC codes, among other examples. In some implementations, the parity information 432 may be used to recover the control information carried in the B-field 430. In some other implementations, the parity information 432 may be used to recover the control information carried in the A-field 420. Still further, in some implementations, the parity information 432 may be used to recover any of the control information carried in the A-field 420 or the B-field 430.

Aspects of the present disclosure recognize that some DECT networks may include legacy portable devices (including DECT devices and legacy ULE devices) that do not support FEC decoding for dummy bearers. Thus, in some implementations, the parity information 432 may be added after the B-field 430 so that the enhanced dummy bearer 400 may be backwards compatible with legacy portable devices. For example, the parity information 432 may be included in an extended B-field payload that conforms with existing DECT packet formats (such as the DECT long slot format). With reference for example to FIG. 2, the first three fields 410-430 of the enhanced dummy bearer 400 are the same as the first three fields 210-230 of the dummy bearer 200. Thus, DECT devices may terminate reception of the enhanced dummy bearer 400 after receiving the A-field 420, and legacy ULE devices 430 may terminate reception of the enhanced dummy bearer 400 after receiving the B-field 430.

Figure 5:
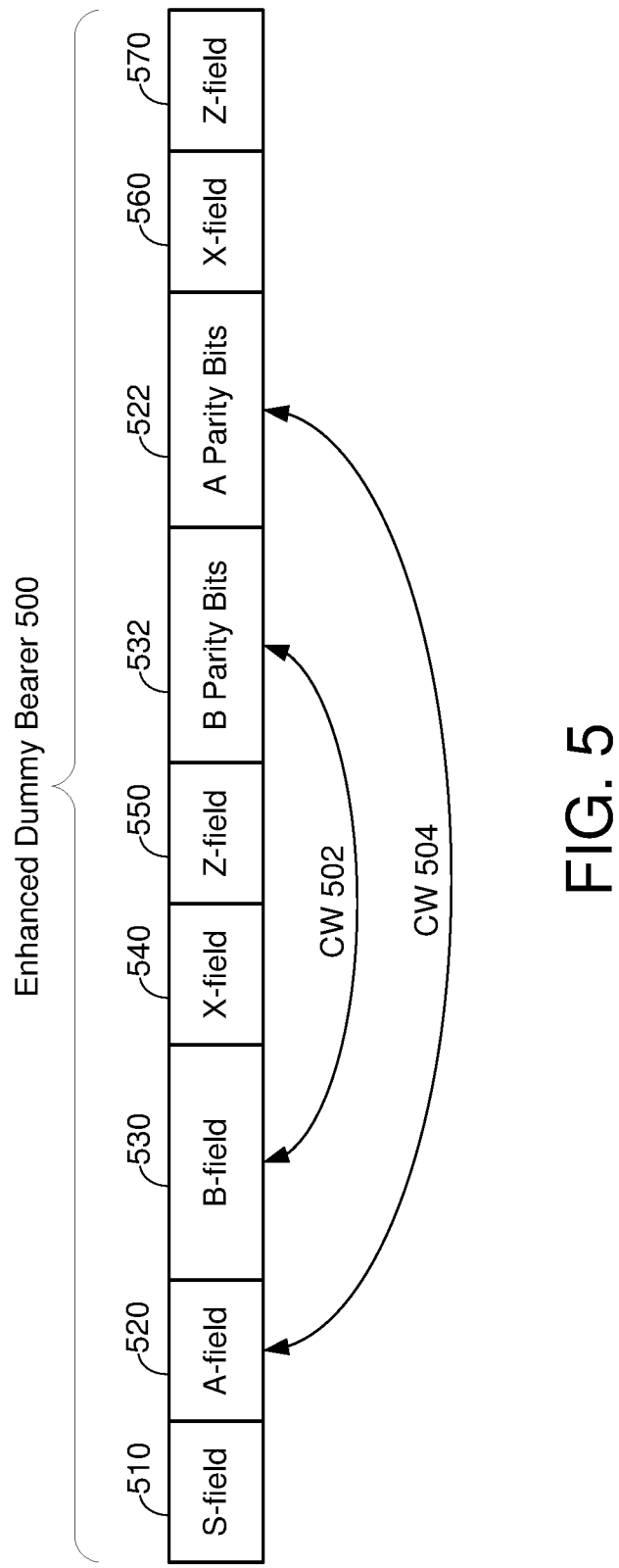
FIG. 5 shows another enhanced dummy bearer usable for wireless communications between a base station and a portable device, according to some implementations.

FIG. 5 shows another enhanced dummy bearer 500 usable for wireless communications between a base station and a portable device, according to some implementations. In some implementations, the enhanced dummy bearer 500 may be one example of the enhanced dummy bearer 400 of FIG. 4.

The enhanced dummy bearer 500 includes an S-field 510, an A-field 520, a B-field 530, a first X-field 540, a first Z-field 550, a second X-field 560, a second Z-field 570, one or more parity bits 532 associated with the B-field 530 (also referred to as "B" parity bits), and one or more parity bits 522 associated with the A-field 520 (also referred to as "A" parity bits). With reference to FIG. 4, the S-field 510, A-field 520, B-field 530, second X-field 560, and second Z-field 570 may be examples of the S-field 410, A-field 420, B-field 430, X-field 440, and Z-field 450, respectively, of the enhanced dummy bearer 400. For example, the S-field 510 may carry a packet preamble and synchronization information which marks the start of a DECT packet transmission; the A-field 520 may carry control information associated with a base station or network; the B-field 530 may carry control information associated with a ULE mode of operation by the base station; the X-field 560 may carry CRC information generated over parts of the B-field 530; and the Z-field 570 may be a duplication of the X-field 560.

In some implementations, the first X-field 540 and the first Z-field 550 may provide backwards compatibility with legacy devices. With reference for example to FIG. 2, the first five fields 510-550 of the enhanced dummy bearer 500 match the first five fields 210-250 of the dummy bearer 200, which conforms with existing DECT ULE standards. In such implementations, the X-field 540 may carry CRC information generated over parts of the B-field 530 and the Z-field 550 may be a duplication of the X-field 540. However, as described with reference to FIG. 2, many legacy portable devices ignore the X-field 240 or the Z-field 250. Thus, in some other implementations, at least one of the first X-field 540 or the first Z-field 550 may be repurposed to carry other information (such as signaling information for the enhanced dummy bearer 500).

The B parity bits 532 and the A parity bits 522 may be examples of the parity information 432 of FIG. 4. In some implementations, the B parity bits 532 may be combined with one or more portions of the B-field 530 to produce one or more FEC codewords 502 that can be decoded according to an FEC decoding scheme, and the A parity bits 522 may be combined with one or more portions of the A-field 520 to produce one or more FEC codewords 504 that can be decoded according to the same (or a different) FEC coding scheme. Example suitable FEC codes include Reed-Solomon codes, turbo codes, and LDPC codes, among other examples. With reference to FIG. 3, each of the FEC codewords 502 and 504 may be one example of the TX codewords 312 (or RX codewords 322). More specifically, the A parity bits 522 may be used to recover control information carried in the A-field 520 and the B parity bits 532 may be used to recover control information carried in the B-field 530.

In some implementations, the B parity bits 532 also may be used to recover information carried in the first X-field 540 or the first Z-field 550. For example, the FEC codewords formed by the B parity bits 532 may include the first X-field 540 or the first Z-field 550 (in addition to one or more portions of the B-field 530). In some other implementations, the B parity bits 532 may not be used to recover any information carried in the first X-field 540 or the first Z-field 550 (such as to improve FEC decoding for the B-field 530). With reference for example to FIG. 2, the first subfield (Subfield 0) of the B-field 530 remains the same or constant across all dummy bearers broadcast by the same base station. Thus, a portable device already knows the information carried in Subfield 0 when receiving the enhanced dummy bearer 500 during normal operation. In some implementations, Subfield 0 of the B-field 530 may not be encoded (or decoded) using FEC coding. In other words, the B parity bits 532 may not be used to recover any of the information in Subfield 0.

As shown in FIG. 5, the B parity bits 532 are transmitted (and received) immediately following the Z-field 550, and the A parity bits 522 are transmitted (and received) immediately following the B parity bits 532. The example arrangement of parity bits 532 and 522 may allow ULE devices to minimize their time of reception for the enhanced dummy bearer 500 during normal operation. As described with reference to FIG. 2, a ULE device may begin receiving the enhanced dummy bearer 500 starting at the B-field 530, during normal operation, thereby ignoring the A-field 520. By inserting the B parity bits 532 before the A parity bits 522 in the enhanced dummy bearer 500, aspects of the present disclosure may allow a ULE device to correct errors in the B-field 530 (if necessary) using the B parity bits 532 and terminate reception of the enhanced dummy bearer 500 prior to receiving the A parity bits 522.

Figure 6A:
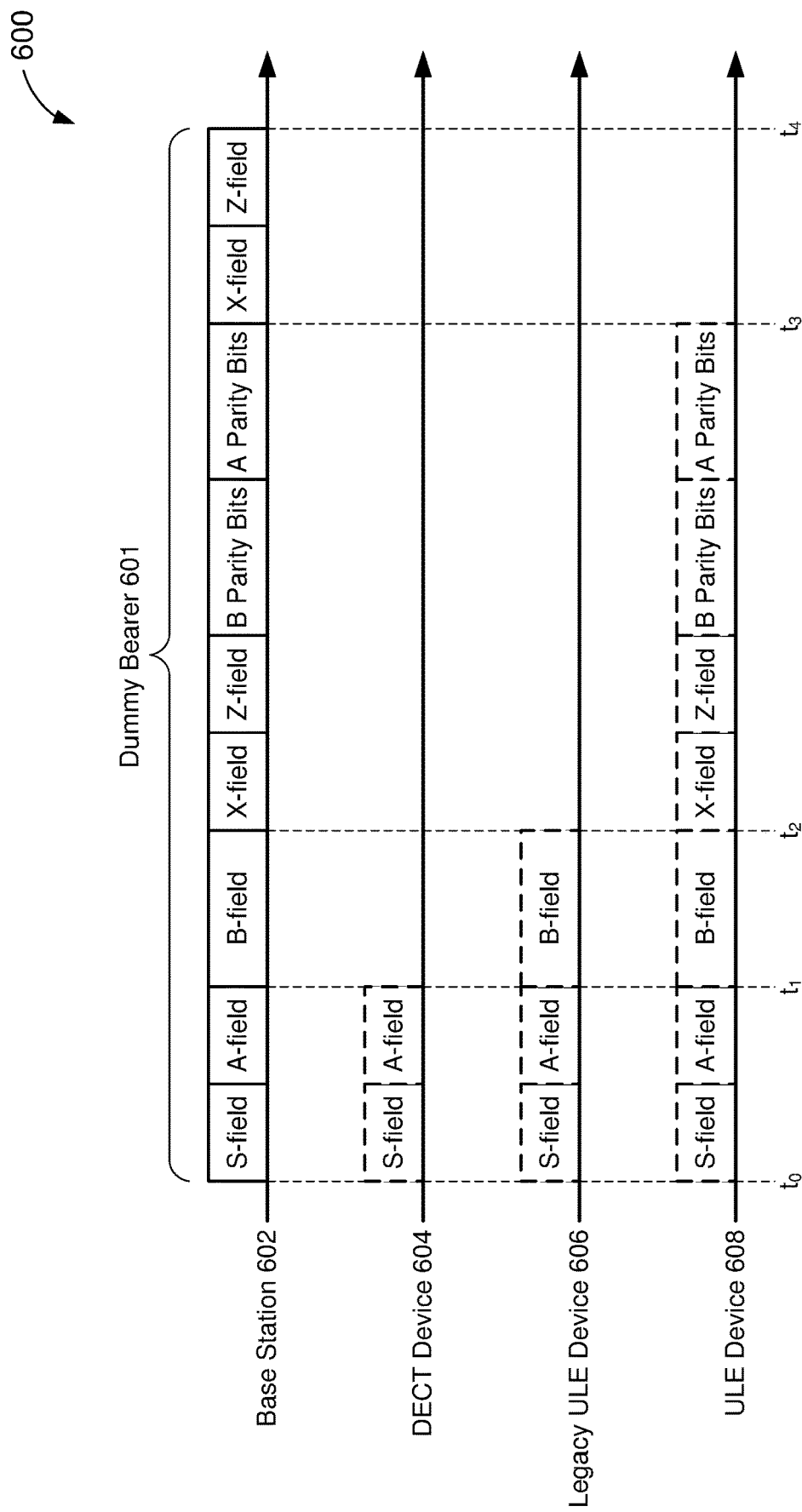
FIGS. 6A and 6B show timing diagrams depicting example communications between a base station and a number of portable devices, according to some implementations.

FIG. 6A shows a timing diagram 600 depicting an example communication between a base station 602 and a number of portable devices 604-608, according to some implementations. In some implementations, the base station 602 may be one example of the base station 114 of FIG. 1, and each of the portable devices 604-608 may be one example of the portable device 120.

The base station 602 broadcasts a dummy bearer 601, between times $t_0$ and $t_4$, which is received by a DECT device 604, a legacy ULE device 606, and a ULE device 608. In some implementations, the dummy bearer 601 may be one example of the enhanced dummy bearer 500 of FIG. 5. More specifically, the dummy bearer 601 includes an S-field, an A-field, a B-field, a first X-field, a first Z-field, one or more B parity bits following the first Z-field, one or more A parity bits following the B parity bits, a second X-field following the A parity bits, and a second Z-field following the second X-field.

The DECT device 604 does not support a ULE mode of operation by the base station 602. Thus, as shown in FIG. 6A, the DECT device 604 receives only the S-field and the A-field of the dummy bearer 601. In other words, the DECT device 604 may terminate its reception of the dummy bearer 601, at time $t_1$, prior to receiving the B-field. To conserve power, a portable device (such as any of the portable devices 604, 606, or 608) may turn off or otherwise deactivate one or more of its wireless radios upon completing or terminating reception of the dummy bearer 601.

The legacy ULE device 606 supports the ULE mode of operation but does not support FEC decoding for dummy bearers. In the example of FIG. 6A, the legacy ULE device 606 receives the dummy bearer 601 during an initial subscription or service call procedure. Thus, the legacy ULE device 606 receives the S-field, A-field, and B-field of the dummy bearer 601. In some implementations, the legacy ULE device 606 may terminate its reception of the dummy bearer 601, at time $t_2$, prior to receiving the first X-field (as shown in FIG. 6A). In some other implementations, the legacy ULE device 606 may terminate its reception of the dummy bearer 601, at time $t_1$, prior to receiving the B-field (such as during an initial subscription). Still further, in some implementations, the legacy ULE device 606 may receive the first X-field and the first Z-field before terminating its reception of the dummy bearer 601.

The ULE device 608 supports the ULE mode of operation and also supports FEC decoding for dummy bearers. In the example of FIG. 6A, the ULE device 608 receives the dummy bearer 601 during an initial subscription or service call procedure. Thus, the ULE device 608 receives the S-field, A-field, and B-field of the dummy bearer 601. In some implementations, the ULE device 608 may further receive the first X-field, the first Z-field, the B-parity bits, and the A-parity bits of the dummy bearer 601 (as shown in FIG. 6A). In some other implementations, the ULE device 608 may terminate its reception of the dummy bearer 601 prior to receiving the B parity bits or the A parity bits (such as when the CRC information carried in the A-field, the B-field, or the X-field indicates that the received data does not contain any errors).

In some implementations, the ULE device 608 may terminate its reception of the dummy bearer 601, at time $t_3$, prior to receiving the second X-field (as shown in FIG. 6A). In some other implementations, the ULE device 608 may receive the dummy bearer 601 in its entirety (including the second X-field and the second Z-field). In some other implementations, the ULE device 608 may terminate its reception of the dummy bearer 601, at time $t_2$, prior to receiving the first X-field (such as when the CRC information carried in the B-field indicates that the received data does not contain any errors). Still further, in some implementations, the ULE device 608 may terminate its reception of the dummy bearer 601, at time $t_1$, prior to receiving the B-field (such as during an initial subscription).

Figure 6B:
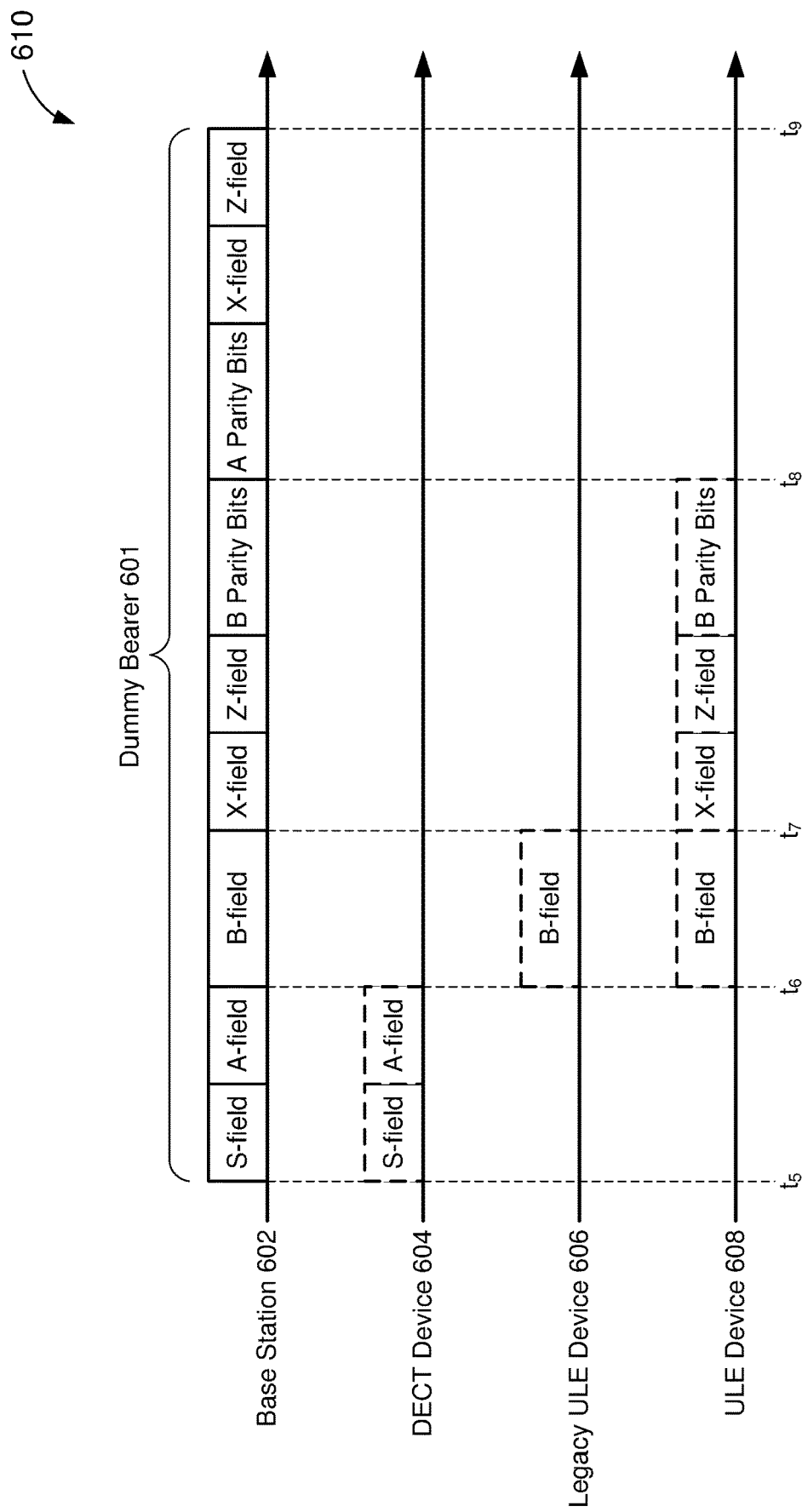

FIG. 6B shows another timing diagram 610 depicting an example communication between the base station 602 and the portable devices 604-608 of FIG. 6A, according to some implementations. In the example of FIG. 6B, the legacy ULE device 606 and the ULE device 608 are configured to operate in a normal mode after the completing the initial subscription or service call procedure described with reference to FIG. 6A.

The base station 602 retransmits the dummy bearer 601, between times $t_5$ and $t_9$, which is received by the DECT device 604, the legacy ULE device 606, and the ULE device 608. In some implementations, the dummy bearer 601 may be one example of the enhanced dummy bearer 500 of FIG. 5. More specifically, the dummy bearer 601 includes an S-field, an A-field, a B-field, a first X-field, a first Z-field, one or more B parity bits following the first Z-field, one or more A parity bits following the B parity bits, a second X-field following the A parity bits, and a second Z-field following the second X-field.

In the example of FIG. 6B, the DECT device 604 receives only the S-field and the A-field of the dummy bearer 601 and the legacy ULE device 606 receives only the B-field of the dummy bearer 601. In other words, the DECT device 604 may terminate its reception of the dummy bearer 601, at time $t_6$, prior to receiving the B-field, whereas the legacy ULE device 606 may not begin receiving the dummy bearer 601 until time $t_6$. In some implementations, the legacy ULE device 606 may terminate its reception of the dummy bearer 601, at time $t_7$, prior to receiving the first X-field (as shown in FIG. 6B). In some other implementations, the legacy ULE device 606 may receive the first X-field and the first Z-field before terminating its reception of the dummy bearer 601.

The ULE device 608 also receives the dummy bearer 601, starting with the B-field, at time $t_6$. In some implementations, the ULE device 608 may further receive the first X-field, the first Z-field, and the B parity bits of the dummy bearer 601 (as shown in FIG. 6B). Because the ULE device 608 ignores the A-field of the dummy bearer 601, the ULE device 608 also may ignore the A parity bits. Thus, the ULE device 608 may terminate its reception of the dummy bearer 601, at time $t_8$, prior to receiving the A parity bits (as shown in FIG. 6B). In some other implementations, the ULE device 608 may terminate its reception of the dummy bearer 601, at time $t_7$, prior to receiving the X-field or the B parity bits (such as when the CRC information carried in the B-field, or the X-field, indicates that the received data does not contain any errors).

Aspects of the present disclosure recognize that, depending on the FEC coding scheme used to encode the A-field or the B-field, the total number of parity bits added to an enhanced dummy bearer (such as the A parity bits plus the B parity bits) may be less than the additional overhead provided by the DECT long slot format (or other DECT packet format used to support the additional parity information). As a result, some enhanced dummy bearers may have one or more spare or unused bits leftover after the parity bits are added. In some implementations, at least some of the spare bits in an enhanced dummy bearer may be repurposed to carry other information (such as signaling information for the enhanced dummy bearer).

Figure 7:
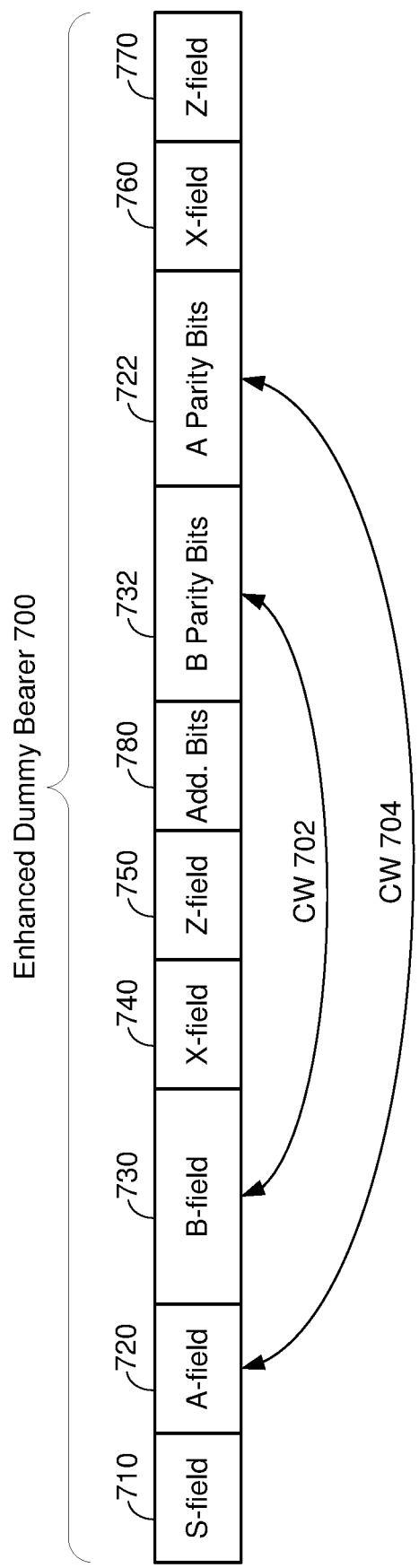
FIG. 7 shows another enhanced dummy bearer usable for wireless communications between a base station and a portable device, according to some implementations.

FIG. 7 shows another enhanced dummy bearer 700 usable for wireless communications between a base station and a portable device, according to some implementations. In some implementations, the enhanced dummy bearer 700 may be one example of the enhanced dummy bearer 400 of FIG. 4.

The enhanced dummy bearer 700 includes an S-field 710, an A-field 720, a B-field 730, a first X-field 740, a first Z-field 750, a second X-field 760, a second Z-field 770, one or more "B" parity bits 732, one or more "A" parity bits 722, and one or more additional bits 780. With reference to FIG. 4, the S-field 710, A-field 720, B-field 730, second X-field 760, and second Z-field 770 may be examples of the S-field 410, A-field 420, B-field 430, X-field 440, and Z-field 450, respectively, of the enhanced dummy bearer 400. For example, the S-field 710 may carry a packet preamble and synchronization information which marks the start of a DECT packet transmission; the A-field 720 may carry control information associated with a base station or network; the B-field 730 may carry control information associated with a ULE mode of operation by the base station; the X-field 760 may carry CRC information generated over parts of the B-field 730; and the Z-field 770 may be a duplication of the X-field 760.

In some implementations, the first X-field 740 and the first Z-field 750 may provide backwards compatibility with legacy devices. With reference for example to FIG. 2, the first five fields 710-750 of the enhanced dummy bearer 700 match the first five fields 210-250 of the dummy bearer 200, which conforms with existing DECT ULE standards. In such implementations, the X-field 740 may carry CRC information generated over parts of the B-field 730 and the Z-field 750 may be a duplicate of the X-field 740. However, as described with reference to FIG. 2, many legacy portable devices ignore the X-field 240 or the Z-field 250. Thus, in some other implementations, at least one of the first X-field 740 or the first Z-field 750 may be repurposed to carry other information (such as signaling information for the enhanced dummy bearer 700).

The B parity bits 732 and the A parity bits 722 may be examples of the parity information 432 of FIG. 4. In some implementations, the B parity bits 732 may be combined with one or more portions of the B-field 730 to produce one or more FEC codewords 702 that can be decoded according to an FEC decoding scheme, and the A parity bits 722 may be combined with one or more portions of the A-field 720 to produce one or more FEC codewords 704 that can be decoded according to the same (or a different) FEC coding scheme. With reference to FIG. 3, each of the FEC codewords 702 and 704 may be one example of the TX codewords 312 (or RX codewords 322). More specifically, the A parity bits 722 may be used to recover control information carried in the A-field 720 and the B parity bits 732 may be used to recover control information carried in the B-field 730. In some implementations, the B parity bits 732 may not be used to recover information carried in at least one of the subfields (such as Subfield 0) of the B-field 730.

In some aspects, the additional bits 780 may carry signaling information associated with the enhanced dummy bearer 700. As shown in FIG. 7, the additional bits 780 are transmitted (and received) immediately following the Z-field 750, the B parity bits 732 are transmitted (and received) immediately following the additional bits 780, and the A parity bits 722 are transmitted (and received) immediately following the B parity bits 732. In some implementations, the additional bits 780 may be merged or combined with at least one of the first X-field 740 or the first Z-field 750 to carry additional signaling information (such as by repurposing the first X-field 740 or the first Z-field 750 to carry signaling information rather than CRC information).

In some implementations, the B parity bits 732 also may be used to recover information carried in the first X-field 740, the first Z-field 750, or the additional bits 780. For example, the FEC codewords formed by the B parity bits 732 may include the first X-field 740, the first Z-field 750, or the additional bits 780 (in addition to one or more portions of the B-field 730). In some other implementations, the B parity bits 732 may not be used to recover any of the information carried in the first X-field 740, the first Z-field 750, or the additional bits 780.

Figure 8A:
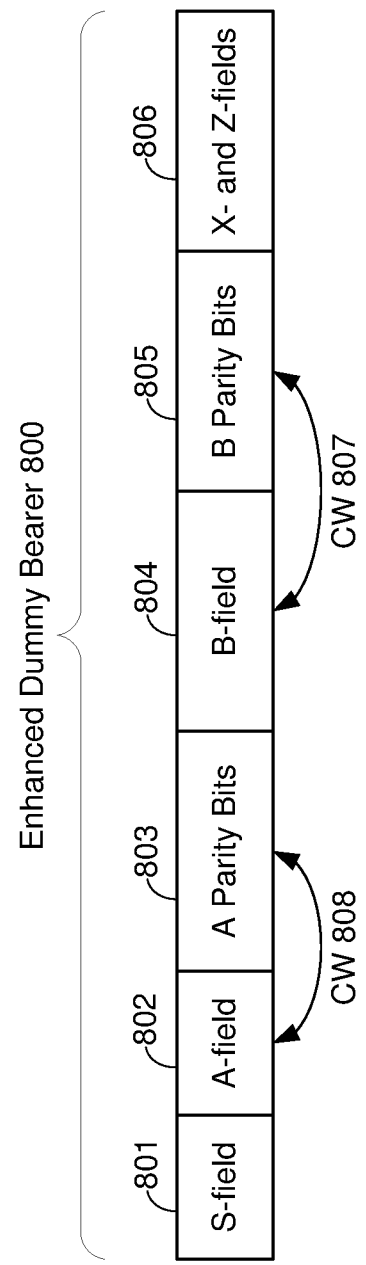
FIG. 8A shows another enhanced dummy bearer usable for wireless communications between a base station and a portable device, according to some implementations.

FIG. 8A shows another enhanced dummy bearer 800 usable for wireless communications between a base station and a portable device, according to some implementations. In some implementations, the enhanced dummy bearer 800 may be one example of the enhanced dummy bearer 400 of FIG. 4.

The enhanced dummy bearer 800 includes an S-field 801, an A-field 802, one or more "A" parity bits 803, a B-field 804, one or more "B" parity bits 805, and X- and Z-fields 806. With reference to FIG. 4, the S-field 801, A-field 802, and B-field 804 may be examples of the S-field 410, A-field 420, and B-field 430, respectively, of the enhanced dummy bearer 400. The X- and Z-fields 806 may be examples of the X-field 440 and the Z-field 450 (shown as combined block, in FIG. 8A, for simplicity). Thus, the S-field 801 may carry a packet preamble and synchronization information which marks the start of a DECT packet transmission; the A-field 802 may carry control information associated with a base station or network; the B-field 804 may carry control information associated with a ULE mode of operation by the base station; and the X- and Z-fields 806 may carry CRC information generated over parts of the B-field 804.

The A parity bits 803 and the B parity bits 805 may be examples of the parity information 432 of FIG. 4. In some implementations, the B parity bits 805 may be combined with one or more portions of the B-field 804 to produce one or more FEC codewords 807 that can be decoded according to an FEC decoding scheme, and the A parity bits 803 may be combined with one or more portions of the A-field 802 to produce one or more FEC codewords 808 that can be decoded according to the same (or a different) FEC coding scheme. Example suitable FEC codes include Reed-Solomon codes, turbo codes, and LDPC codes, among other examples. With reference to FIG. 3, each of the FEC codewords 807 and 808 may be one example of the TX codewords 312 (or RX codewords 322). More specifically, the A parity bits 803 may be used to recover control information carried in the A-field 802 and the B parity bits 805 may be used to recover control information carried in the B-field 804. In some implementations, the B parity bits 805 may not be used to recover information carried in at least one of the subfields (such as Subfield 0) of the B-field 804.

As shown in FIG. 8A, the A parity bits 803 are transmitted (and received) immediately following the A-field 802, the B-field 804 is transmitted (and received) immediately following the A parity bits 803, and the B parity bits 805 are transmitted (and received) immediately following the B-field 804. Compared to the enhanced dummy bearers 500, 601, and 700 described with reference to FIGS. 5-7, the example arrangement of parity bits 803 and 805 allows for earlier decoding of the A-field 802 (such as before the B-field 804) and correcting of errors therein. However, because the A-field 802 can be ignored by ULE devices operating in the normal mode, the benefits of such early decoding for the A-field 802 may be limited. Further, because the A parity bits 803 are inserted between the A-field 802 and the B-field 804, the enhanced dummy bearer 800 is not backwards compatible with legacy portable devices.

Figure 8B:
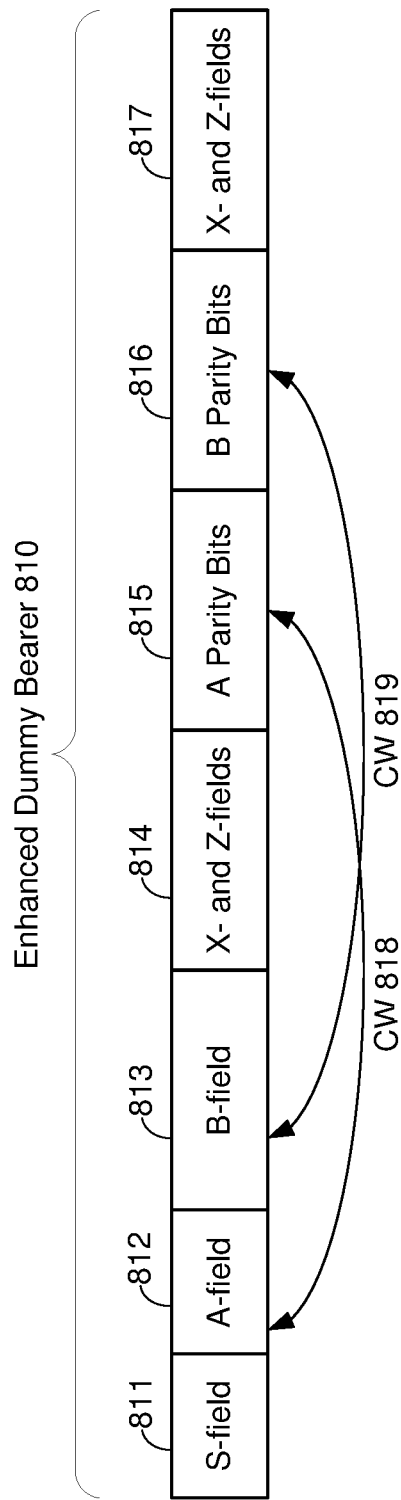
FIG. 8B shows another enhanced dummy bearer usable for wireless communications between a base station and a portable device, according to some implementations.

FIG. 8B shows another enhanced dummy bearer 810 usable for wireless communications between a base station and a portable device, according to some implementations. In some implementations, the enhanced dummy bearer 810 may be one example of the enhanced dummy bearer 400 of FIG. 4.

The enhanced dummy bearer 810 includes an S-field 811, an A-field 812, a B-field 813, first X- and Z-fields 814, one or more "A" parity bits 815, one or more "B" parity bits 816, and second X- and Z-fields 817. With reference to FIG. 4, the S-field 811, A-field 812, and B-field 813 may be examples of the S-field 410, A-field 420, and B-field 430, respectively, of the enhanced dummy bearer 400. The second X- and Z-fields 817 may be examples of the X-field 440 and the Z-field 450 (shown as a combined block, in FIG. 8B, for simplicity). Thus, the S-field 811 may carry a packet preamble and synchronization information which marks the start of a DECT packet transmission; the A-field 812 may carry control information associated with a base station or network; the B-field 813 may carry control information associated with a ULE mode of operation by the base station; and the second X- and Z-fields 817 may carry CRC information generated over parts of the B-field 813.

The A parity bits 815 and the B parity bits 816 may be examples of the parity information 432 of FIG. 4. In some implementations, the A parity bits 815 may be combined with one or more portions of the A-field 812 to produce one or more FEC codewords 818 that can be decoded according to an FEC decoding scheme, and the B parity bits 816 may be combined with one or more portions of the B-field 813 to produce one or more FEC codewords 819 that can be decoded according to the same (or a different) FEC coding scheme. With reference to FIG. 3, each of the FEC codewords 818 and 819 may be one example of the TX codewords 312 (or RX codewords 322). More specifically, the A parity bits 815 may be used to recover control information carried in the A-field 812 and the B parity bits 816 may be used to recover control information carried in the B-field 813. In some implementations, the B parity bits 816 may not be used to recover information carried in at least one of the subfields (such as Subfield 0) of the B-field 813.

In some implementations, the first X- and Z-fields 814 may provide backwards compatibility with legacy devices. With reference for example to FIG. 2, the first five fields 811-814 of the enhanced dummy bearer 810 match the first five fields 210-250 of the dummy bearer 200, which conforms with existing DECT ULE standards. In such implementations, the first X- and Z-fields 814 may carry CRC information generated over parts of the B-field 813. In some other implementations, the first X- and Z-fields 814 may be repurposed to carry other information (such as signaling information for the enhanced dummy bearer 810). In some implementations, the A parity bits 815 or the B parity bits 816 also may be used to recover information carried in the first X- and Z-fields 814. In such implementations, the FEC codewords 818 or 819 may include the first X- and Z-fields 814 (in addition to one or more portions of the A-field 812 or the B-field 813, respectively).

As shown in FIG. 8B, the A parity bits 815 are transmitted (and received) immediately following the first X- and Z-fields 814, and the B parity bits 816 are transmitted (and received) immediately following the A parity bits 815. Compared to the enhanced dummy bearers 500, 601, and 700 described with reference to FIGS. 5-7, the example arrangement of parity bits 815 and 816 allows for earlier decoding of the A-field 812 (such as before the B-field 813), and correcting of errors therein, while maintaining backwards compatibility with legacy portable devices. However, because the A-field 812 can be ignored by ULE devices operating in the normal mode, the benefits of such early decoding for the A-field 812 may be limited.

Figure 8C:
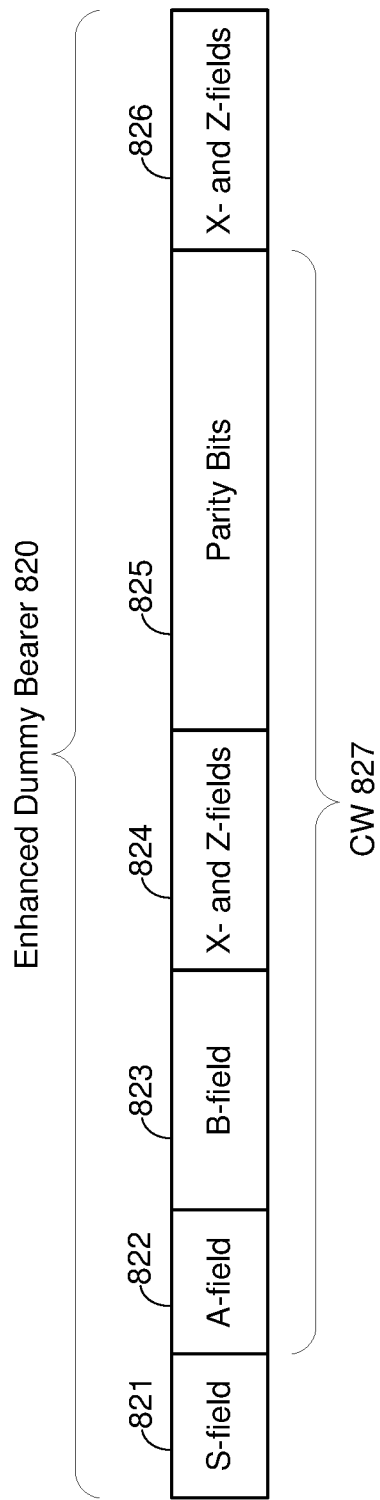
FIG. 8C shows another enhanced dummy bearer usable for wireless communications between a base station and a portable device, according to some implementations.

FIG. 8C shows another enhanced dummy bearer 820 usable for wireless communications between a base station and a portable device, according to some implementations. In some implementations, the enhanced dummy bearer 820 may be one example of the enhanced dummy bearer 400 of FIG. 4.

The enhanced dummy bearer 820 includes an S-field 821, an A-field 822, a B-field 823, first X- and Z-fields 824, one or more parity bits 825, and second X- and Z-fields 826. With reference to FIG. 4, the S-field 821, A-field 822, and B-field 823 may be examples of the S-field 410, A-field 420, and B-field 430, respectively, of the enhanced dummy bearer 400. The second X- and Z-fields 826 may be examples of the X-field 440 and the Z-field 450 (shown as a combined block, in FIG. 8C, for simplicity). Thus, the S-field 821 may carry a packet preamble and synchronization information which marks the start of a DECT packet transmission; the A-field 822 may carry control information associated with a base station or network; the B-field 823 may carry control information associated with a ULE mode of operation by the base station; and the second X- and Z-fields 826 may carry CRC information generated over parts of the B-field 823.

In some implementations, the first X- and Z-fields 824 may provide backwards compatibility with legacy devices. With reference for example to FIG. 2, the first five fields 821-824 of the enhanced dummy bearer 820 match the first five fields 210-250 of the dummy bearer 200, which conforms with existing DECT ULE standards. In such implementations, the first X- and Z-fields 824 may carry CRC information generated over parts of the B-field 823. In some other implementations, the first X- and Z-fields 824 may be repurposed to carry other information (such as signaling information for the enhanced dummy bearer 820).

The parity bits 825 may be one example of the parity information 432 of FIG. 4. In some implementations, the parity bits 825 may be combined with the A-field 822, the B-field 823, and the first X- and Z-fields 824 to produce one or more FEC codewords 827 that can be decoded according to an FEC decoding scheme. With reference to FIG. 3, the FEC codewords 827 may be one example of the TX codewords 312 (or RX codewords 322). More specifically, the parity bits 825 may be used to recover control information carried in the A-field 822 and the B-field 823 as well as CRC (or signaling) information carried in the first X- and Z-fields 824.

As shown in FIG. 8C, the parity bits 825 can be used to decode the A-field 822 and the B-field 823, collectively, and correct any errors therein. This allows a large portion of the enhanced dummy bearer 820 to be encoded (and decoded) using a single FEC coding operation. Thus, compared to the enhanced dummy bearers 500, 601, and 700 described with reference to FIGS. 5-7, the enhanced dummy bearer 820 may be simpler to implement. However, because the A-field 822 and the B-field 823 are required for FEC decoding, a ULE device cannot begin to receive the enhanced dummy bearer 820 starting at the B-field 823 or terminate its reception of the enhanced dummy bearer 820 prior to receiving all of the parity bits 825 (without sacrificing use of the parity bits 825).

Figure 8D:
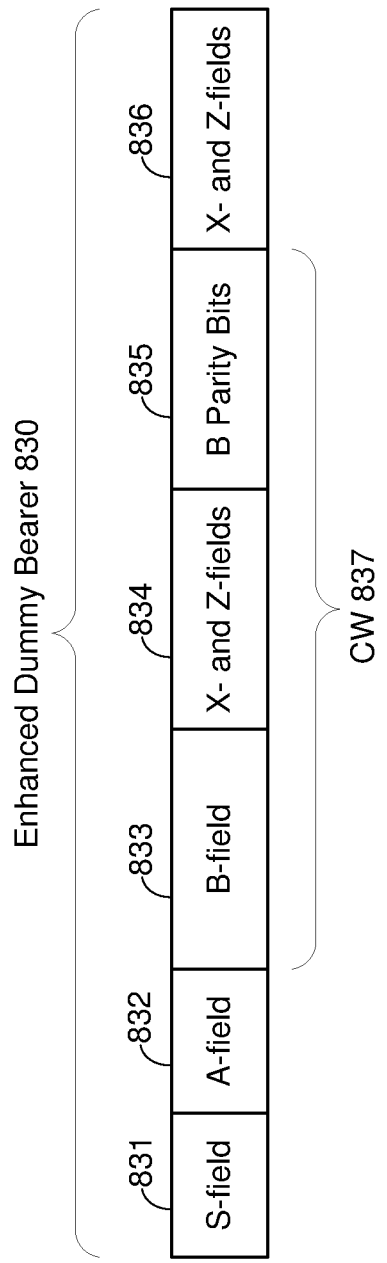
FIG. 8D shows another enhanced dummy bearer usable for wireless communications between a base station and a portable device, according to some implementations.

FIG. 8D shows another enhanced dummy bearer 830 usable for wireless communications between a base station and a portable device, according to some implementations. In some implementations, the enhanced dummy bearer 830 may be one example of the enhanced dummy bearer 400 of FIG. 4.

The enhanced dummy bearer 830 includes an S-field 831, an A-field 832, a B-field 833, first X- and Z-fields 824, one or more "B" parity bits 835, and second X- and Z-fields 836. With reference to FIG. 4, the S-field 831, A-field 832, and B-field 833 may be examples of the S-field 410, A-field 420, and B-field 430, respectively, of the enhanced dummy bearer 400. The second X- and Z-fields 836 may be examples of the X-field 440 and the Z-field 450 (shown as a combined block, in FIG. 8D, for simplicity). Thus, the S-field 831 may carry a packet preamble and synchronization information which marks the start of a DECT packet transmission; the A-field 832 may carry control information associated with a base station or network; the B-field 833 may carry control information associated with a ULE mode of operation by the base station; and the second X- and Z-fields 836 may carry CRC information generated over parts of the B-field 833.

The B parity bits 835 may be one example of the parity information 432 of FIG. 4. In some implementations, the B parity bits 835 may be combined with one or more portions of the B-field 833 to produce one or more FEC codewords 837 that can be decoded according to a FEC coding scheme. With reference to FIG. 3, the FEC codewords 837 may be one example of the TX codewords 312 (or RX codewords 322). More specifically, the B parity bits 835 may be used to recover control information carried in the B-field 833. In some implementations, the B parity bits 835 may not be used to recover information carried in at least one of the subfields (such as Subfield 0) of the B-field 833.

In some implementations, the first X- and Z-fields 834 may provide backwards compatibility with legacy devices. With reference for example to FIG. 2, the first five fields 831-834 of the enhanced dummy bearer 830 match the first five fields 210-250 of the dummy bearer 200, which conforms with existing DECT ULE standards. In such implementations, the first X- and Z-fields 834 may carry CRC information generated over parts of the B-field 833. In some other implementations, the first X- and Z-fields 834 may be repurposed to carry other information (such as signaling information for the enhanced dummy bearer 830). In some implementations, the B parity bits 835 also may be used to recover information carried in the first X- and Z-fields 834. In such implementations, the FEC codewords 837 may include the first X- and Z-fields 834 (in addition to one or more portions of the B-field 833).

As shown in FIG. 8D, the enhanced dummy bearer 830 does not support FEC encoding of the A-field 832. Compared to the enhanced dummy bearers 500, 601, and 700 described with reference to FIGS. 5-7, more parity information can be allocated for FEC encoding the B-field 833 of the enhanced dummy bearer 830. In other words, the enhanced dummy bearer 830 may include a greater number of B parity bits than any of the enhanced dummy bearers 500, 601, or 700. This may improve the performance of FEC decoding for the B-field 833 while being simpler to implement. However, because the enhanced dummy bearer 830 does not include any "A" parity bits, a ULE device cannot perform error correction (or FEC decoding) on the A-field 832 during subscription or service call procedures.

Aspects of the present disclosure further recognize that data interleaving (such as re-ordering the sequence of bits in a packet) may further improve the FEC coding performance of any of the enhanced dummy bearers 500, 601, 700, and 800-830 described with reference to FIGS. 5-8D. However, existing versions of the DECT ULE standard do not support data interleaving for dummy bearers. As such, an enhanced dummy bearer with interleaved data may not be backward compatible with legacy devices. Further, because data interleaving changes the order of bits in a packet, a portable device may need to receive an interleaved dummy bearer in its entirety to recover all of the data for any one field. As a result, the portable device may not be able to terminate reception of the dummy bearer early (such as before the end of the packet) or initiate reception of the dummy bearer late (such as after the beginning of the packet).

Figure 9:
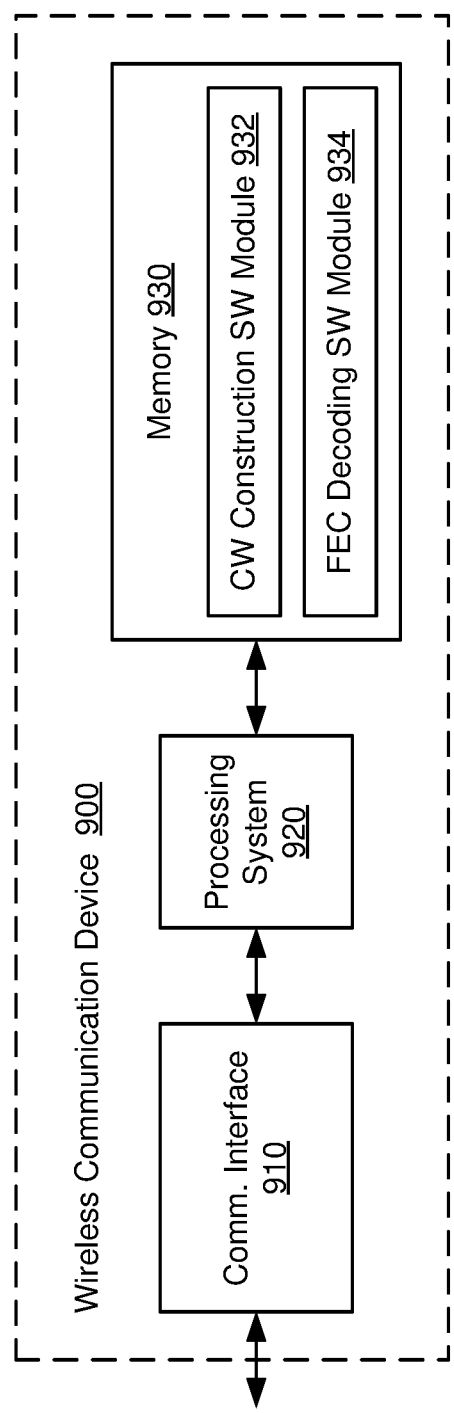
FIG. 9 shows a block diagram of an example wireless communication device, according to some implementations.

FIG. 9 shows a block diagram of an example wireless communication device 900, according to some implementations. In some implementations, the wireless communication device 900 may be one example of a portable device associated with a DECT ULE network (or HAN), such as the portable device 120 of FIG. 1 or the ULE device 608 of FIGS. 6A and 6B. With reference for example to FIG. 1, the portable device may be configured to communicate with a base station over a wireless communication channel (such as a DECT air interface).

The wireless communication device 900 includes a communication interface 910, a processing system 920, and a memory 930. The communication interface 910 is configured to communicate with the base station over the wireless communication channel. In some implementations, the communication interface 910 may receive, over the wireless communication channel, at least a portion of a dummy bearer that includes a B-field followed by one or more parity bits, where the B-field carries control information associated with a ULE mode of operation by a DECT base station.

The memory 930 includes a non-transitory computer-readable medium (including one or more nonvolatile memory elements, such as EPROM, EEPROM, Flash memory, or a hard drive, among other examples) that may store at least the following software (SW) modules:

a CW construction SW module 932 to construct a codeword that includes at least part of the B-field and the one or more parity bits; and
a FEC decoding SW module 934 to recover the control information based on the codeword and an FEC code associated with the codeword.

Each software module includes instructions that, when executed by the processing system 920, causes the wireless communication device 900 to perform the corresponding functions.

The processing system 920 may include any suitable one or more processors capable of executing scripts or instructions of one or more software programs stored in the wireless communication device 900 (such as in the memory 930). For example, the processing system 920 may execute the CW construction SW module 932 to construct a codeword that includes at least part of the B-field and the one or more parity bits. The processing system 920 may further execute the FEC decoding SW module 934 to recover the control information based on the codeword and an FEC code associated with the codeword.

Figure 10:
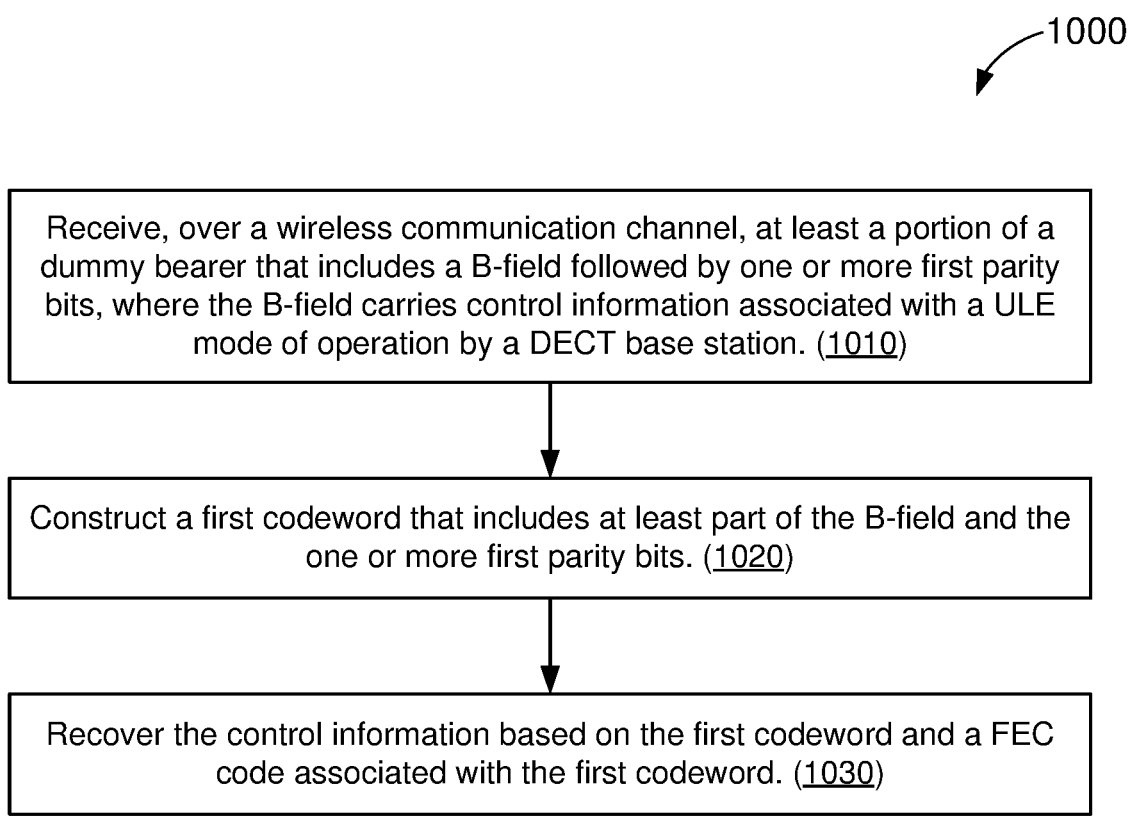
FIG. 10 shows an illustrative flowchart depicting an example operation for wireless communications, according to some implementations.

FIG. 10 shows an illustrative flowchart depicting an example operation 1000 for wireless communications, according to some implementations. In some implementations, the example operation 1000 may be performed by a wireless communication device such as the portable device 120 of FIG. 1, the ULE device 608 of FIGS. 6A and 6B, or the wireless communication device 900 of FIG. 9.

The wireless communication device receives, over a wireless communication channel, at least a portion of a dummy bearer that includes a B-field followed by one or more first parity bits, where the B-field carries control information associated with a ULE mode of operation by a DECT base station (1010). The wireless communication device constructs a first codeword that includes at least part of the B-field and the one or more first parity bits (1020). In some implementations, the first codeword may exclude a first subfield of the B-field, where the first subfield signals the start of the B-field. The wireless communication device recovers the control information based on the first codeword and an FEC code associated with the first codeword (1030).

In some aspects, the dummy bearer may further include X- and Z-fields following the B-field and preceding the one or more first parity bits. In some implementations, the X- and Z-fields may carry CRC information associated with the B-field. In some other implementations, the X- and Z-fields may carry signaling information associated with the dummy bearer. In some implementations, the first codeword may further include the X- and Z-fields.

In some aspects, the one or more first parity bits may be received immediately after the Z-field. In some other aspects, the dummy bearer may further include one or more non-parity bits between the Z-field and the one or more first parity bits. In some implementations, the one or more non-parity bits may carry signaling information associated with the dummy bearer.

In some aspects, the dummy bearer may further include an A-field carrying legacy control information associated with the DECT base station and one or more second parity bits following the A-field. In some implementations, the one or more second parity may be received after the one or more first parity bits. In some implementations, the wireless communication device may further construct a second codeword that includes at least part of the A-field and the one or more second parity bits and recover the legacy control information based on the second codeword and a FEC code associated with the second codeword.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the disclosure.

The methods, sequences or algorithms described in connection with the aspects disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

In the foregoing specification, embodiments have been described with reference to specific examples thereof. It will, however, be evident that various modifications and changes may be made thereto without departing from the broader scope of the disclosure as set forth in the appended claims. The specification and drawings are, accordingly, to be regarded in an illustrative sense rather than a restrictive sense.

What is claimed is:

1. A method for wireless communication performed by a wireless communication device, comprising:
   receiving, over a wireless communication channel, at least a portion of a dummy bearer that includes a B-field followed by one or more first parity bits, the B-field carrying control information associated with an ultra low energy (ULE) mode of operation by a digital enhanced cordless telecommunications (DECT) base station;
   constructing a first codeword that includes at least part of the B-field and the one or more first parity bits; and
   recovering the control information based on the first codeword and a forward error correction (FEC) code associated with the first codeword.

2. The method of claim 1, wherein the first codeword excludes a first subfield of the B-field, the first subfield signaling the start of the B-field.

3. The method of claim 1, wherein the dummy bearer further includes X- and Z-fields following the B-field and preceding the one or more first parity bits.

4. The method of claim 3, wherein the X- and Z-fields carry cyclic redundancy check (CRC) information associated with the B-field.

5. The method of claim 3, wherein the X- and Z-fields carry signaling information associated with the dummy bearer.

6. The method of claim 3, wherein the first codeword further includes the X- and Z-fields.

7. The method of claim 3, wherein the one or more first parity bits are received immediately after the Z-field.

8. The method of claim 3, wherein the dummy bearer further includes one or more non-parity bits between the Z-field and the one or more first parity bits.

9. The method of claim 8, wherein the one or more non-parity bits carry signaling information associated with the dummy bearer.

10. The method of claim 1, wherein the dummy bearer further includes an A-field carrying legacy control information associated with the DECT base station and one or more second parity bits following the A-field.

11. The method of claim 10, wherein the one or more second parity are received after the one or more first parity bits.

12. The method of claim 10, further comprising:
   constructing a second codeword that includes at least part of the A-field and the one or more second parity bits; and
   recovering the legacy control information based on the second codeword and a FEC code associated with the second codeword.

13. A wireless communication device comprising:
   a processing system; and
   a memory storing instructions that, when executed by the processing system, causes the wireless communication device to:
   receive, over a wireless communication channel, at least a portion of a dummy bearer that includes a B-field followed by one or more first parity bits, the B-field carrying control information associated with an ultra low energy (ULE) mode of operation by a digital enhanced cordless telecommunications (DECT) base station;

construct a first codeword that includes at least part of the B-field and the one or more first parity bits; and recover the control information based on the first codeword and a forward error correction (FEC) code associated with the first codeword.

14. The wireless communication device of claim 13, wherein the first codeword excludes a first subfield of the B-field, the first subfield signaling the start of the B-field.

15. The wireless communication device of claim 13, wherein the dummy bearer further includes X- and Z-fields following the B-field and preceding the one or more first parity bits.

16. The wireless communication device of claim 15, wherein the X- and Z-fields carry cyclic redundancy check (CRC) information associated with the B-field.

17. The wireless communication device of claim 15, wherein the X- and Z-fields carry signaling information associated with the dummy bearer.

18. The wireless communication device of claim 15, wherein the first codeword further includes the X- and Z-fields.

19. The wireless communication device of claim 15, wherein the dummy bearer further includes one or more non-parity bits between the Z-field and the one or more first parity bits, the one or more non-parity bits carrying signaling information associated with the dummy bearer.

20. The wireless communication device of claim 13, wherein the dummy bearer further includes an A-field carrying legacy control information associated with the DECT base station and one or more second parity bits following the A-field, execution of the instructions further causing the wireless communication device to:

construct a second codeword that includes at least part of the A-field and the one or more second parity bits; and recover the legacy control information based on the second codeword and a FEC code associated with the second codeword.

* * * * *